Figure 1:
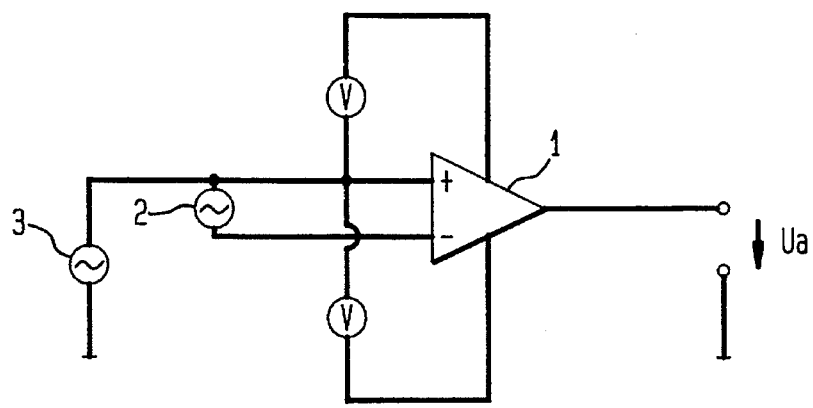

US005535273A

United States Patent [19]
Kausel et al.

[11] Patent Number: 5,535,273
[45] Date of Patent: Jul. 9, 1996

[54] CIRCUITRY FOR SUPERIMPOSING SMALL, LOW ENERGY SIGNALS AND LARGE, ESSENTIALLY HIGHER ENERGY SIGNALS

[75] Inventors: Wilfried Kausel; Hannes Kremser; Hermann Stallbaumer; Werner Winkler, all of Vienna, Austria

[73] Assignee: SEMCOTEC Handelsgesellschaft m.b.H., Vienna, Austria

[21] Appl. No.: 295,766

[22] PCT Filed: Mar. 3, 1993

[86] PCT No.: PCT/AT93/00035

§ 371 Date: Oct. 27, 1994

§ 102(e) Date: Oct. 27, 1994

[87] PCT Pub. No.: WO93/15353

PCT Pub. Date: Aug. 5, 1993

[30] Foreign Application Priority Data

Mar. 4, 1992 [AT] Austria ............................ 414/92

[51] Int. Cl.⁶ .................................................. H04N 9/08
[52] U.S. Cl. ........................ 379/399; 379/413; 379/418; 379/400
[58] Field of Search ............................ 379/399, 413, 379/400, 418; 330/10, 285, 278, 279, 251

[56] References Cited

U.S. PATENT DOCUMENTS 4,371,840  2/1983  Yokoyama ........................ 330/10
4,495,382  1/1985  Smith et al. ..................... 379/400
5,396,555  3/1995  Shibata et al. .................. 379/413

FOREIGN PATENT DOCUMENTS 0399997  11/1990  European Pat. Off. .
0408137  1/1991   European Pat. Off. .
2596596  10/1987  France .

OTHER PUBLICATIONS

Electronics & Wireless World, vol. 93, No. 1614, 1987, pp. 415–420.

Primary Examiner—Jeffery Hofsass
Assistant Examiner—Jacques M. Saint-Surin
Attorney, Agent, or Firm—Henry M. Feiereisen

[57] ABSTRACT

A circuitry is disclosed for superimposing small, low energy (2) and large substantially higher energy (3) signals, in particular for transmitting speech signals with a remote supply direct signal for a receiving circuit or with a high energy alternating signal, for example a call alternating voltage for signaling. The circuitry includes an operational amplifier (1), having one input connected to a pole of a source supplying the small signal and operational voltage inputs being connected to a voltage supply source. In order to allow low energy, weak signals, such as speech signals, and high energy signals and direct voltages to be transmitted by such a circuitry over a subscriber line by means of simple components, the second pole of the small signal source (2) is connected to the second input of the operational amplifier (1) and one pole of a higher energy signal supply source (3) is connected to one pole of the voltage supply source (V).

39 Claims, 1 Drawing Sheet

CIRCUITRY FOR SUPERIMPOSING SMALL, LOW ENERGY SIGNALS AND LARGE, ESSENTIALLY HIGHER ENERGY SIGNALS

The invention refers to a circuitry for superimposing small, low energy and large, essentially higher energy signals, in particular for transmitting speech signals with a direct signal for the remote supply of a receiving circuit or with a high energy alternating signal, e.g. a call alternating voltage for signaling, with the circuitry including an operational amplifier having one input connected to a pole of a source supplying the small signal and operational voltage inputs connected to a voltage supply source.

Currently, the superimposition e.g. of speech signals and supply voltage is mostly attained with the aid of a transformer, with the e.g. one call alternating voltage being actually supplied in a telephone system via a relay to the subscriber lines. During this time, the speech signal source is completely separated from the subscriber lines. Since transformers as well as relays are relatively large and expensive components and especially relays as mechanical components are highly susceptible to wear, the use of such components results in respective drawbacks.

With the conventional SLIC (subscriber line interface circuit), a solution of this problem is proposed in the manner that the subscriber lines are activated by integrated amplifiers whereby the output voltage area of these amplifiers must contain the entire small and large signal control range of the subscriber line. The switching circuits must therefore be built in accordance with a technology in which the electric strength has to correspond to the greatest occurring signal. Typically, these are 48 V to 60 V for the remote supply and up to 180 $V_{pp}$ for the call alternating voltage, whereupon the speech alternating voltage lies in the area of 2–3 $V_{pp}$. This realization however results necessarily in the drawback of a very great power loss at the 180 V operational amplifiers whereby the required electric strength necessitates the use of very large transistors so that only very few functions can be integrated on a chip of acceptable dimension.

It is an object of the invention to eliminate these drawbacks and to propose a circuitry of the above-stated type by which the transmission of low energy, weak signals, e.g. speech signals and high energy signals and direct voltages to a subscriber line is possible in a simple manner without requiring transformers and relays and without using especially voltage-stable operational amplifiers.

In accordance with the invention, this is attained by connecting the second pole of the source supplying the low energy signals with the second input of the operational amplifier and by connecting a pole of a source supplying a high energy signal with a pole of the supply voltage source.

These measures make it e.g. possible to control one or both conductors of a subscriber line in a telephone system with operational amplifiers, with its control range and thus also with its supply voltage, which essentially determines the occurring power loss, being suited only to the occurring small signals e.g. the speech signal, and being insulated from the remaining circuitry components such that their supply voltage reference potential can be connected with a source of the high energy signals.

The transmission of the speech signals to the differential voltage inputs of the insulated amplifier or amplifiers may thereby be randomly modulated or unmodulated e.g. capacitively, galvanically or optically, either analog or digital.

For increasing the voltage modulation capability of an operational amplifier, it has also been already proposed to relate the supply voltage to the outlet voltage, with the supply voltage source being linked to the outlet of the operational amplifier.

According to a further feature of the invention, it may be provided to link one pole of the source supplying the high energy signals with an input of the operational amplifier with which also one pole of the supply voltage source is in communication.

These measures result in a very simple structure of the circuitry according to the invention.

Furthermore, it may also be provided to connect one pole of the source supplying the high energy signals with an operational voltage input of the operational amplifier.

This results in a superimposition of the supply voltage with the high energy signals.

According to a further feature of the invention, it may be provided to form the source supplying the high energy signals by a clocked voltage transformer which has a control input receiving a control signal.

In this manner, the source for the high energy signals is highly efficient, without requiring special structural designs of cooling bodies.

Figure 2:
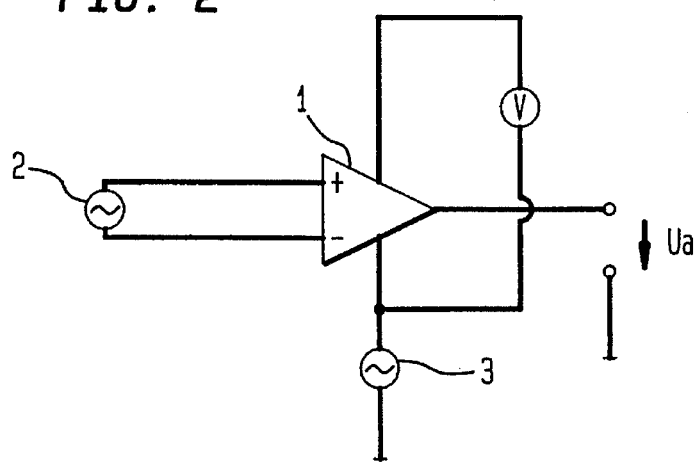
Figure 3:
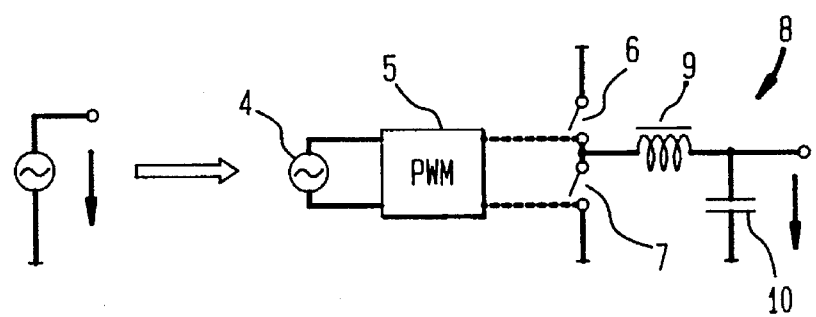

The invention will now be explained in more detail with reference to the drawing in which:

FIG. 1 shows schematically a first embodiment of a circuitry according to the invention, FIG. 2 shows a further embodiment of a circuitry according to the invention, and FIG. 3 shows schematically a source for generating a high energy signal.

In the embodiment according to FIG. 1, a signal source 2 for generating small, low energy signals is connected to both signal inputs + and − of an operational amplifier 1 with preset amplification, with a resistor R1 being interposed. Furthermore, a source 3 for supplying high energy signals is connected with one of its poles to the signal inlet + of the operational amplifier 1.

Also linked to this input + of the operational amplifier 1 are the one poles of two supply voltage sources V1, V2 to thereby relate the supply voltage to the input of the operational amplifier 1.

The output of the operational amplifier 1 is fed back via a resistor R2 to the inverting input −.

The output voltage $U_a$ is tapped against the reference potential of the source 3 for supply of the high energy signals.

In the embodiment according to FIG. 2, the source 2 for supplying the low energy signals is also connected to the inverting input − and the non-inverting input of the operational amplifier 1. The source 3 for supplying the high energy signals is however linked in this embodiment with an operational voltage input of the operational amplifier 1, which input is also linked to a pole of a supply voltage source V, the second pole of which being connected to the second operational voltage input of the operational amplifier 1.

Also in this embodiment, the delivery of the output voltage $U_a$ occurs against the reference potential of the source 3 for supplying the high energy signals.

An example of a source 3 for supplying high energy signals is illustrated in FIG. 3.

In this embodiment, a signal source 4 which supplies weak signals controls a pulse-width modulator 5 which controls the switches 6 and 7, usually designed as electronic switches, of a clocked voltage transformer 8. This voltage transformer may be of random design. In the illustrated embodiment, the voltage transformer 8 is formed through a series connection of a choke 9 and a capacitor 10, with the amplified signal voltage being tapped at the point of connection of the choke 9 with the capacitor 10 against a reference potential.

We claim:

1. A circuitry for superimposing a small, low energy signal from a first source and large, essentially higher energy signals from a second source, the first and second sources each having respective first and second poles, more particularly for transmitting speech signals with a direct signal for remotely supplying a load comprising a receiving circuit or with a high energy alternating signal, with the circuitry including an operational amplifier having first and second inputs, having the first input connected to a first pole of the first source, and having supply voltage inputs connected to a voltage supply source, characterized in that a second pole of the first source is connected with the second input of the operational amplifier and in that one pole of the second source is connected with a pole of the voltage supply source.

2. Circuitry according to claim 1, characterized in that one of the poles of the second source is connected with an input of the operational amplifier and is further coupled to one of the poles of the voltage supply source.

3. Circuitry according to claim 1, characterized in that one of the poles of the second source is connected with one of the supply voltage inputs.

4. Circuitry according to claim 1, characterized in that the second source comprises a clocked voltage transformer which has a control input receiving a control signal.

5. A circuit arrangement for transmitting to a remote receiver a relatively small audio signal voltage including a DC component of a given value, and a relatively large alternating signal voltage, said circuit arrangement comprising an operational amplifier having a differential input, an output, and a pair of power supply terminals for receiving therebetween an operating voltage from a power supply, wherein said audio signal voltage is applied in a differential mode to said differential input; and said alternating signal voltage is applied to said differential amplifier by way of said power supply terminals.

6. A circuit arrangement in accordance with claim 5, wherein said alternating signal voltage is applied in common mode to said power supply terminals with a DC potential difference between said power supply terminals corresponding to said operating voltage.

7. A circuit arrangement in accordance with claim 5, wherein said operating voltage from said power supply is referenced to said alternating signal voltage.

8. A circuit arrangement in accordance with claim 7, wherein said power supply is floating and has a referencing input node for receiving a referencing potential for said supply voltage is applied between a point of a reference potential and said referencing input node.

9. A circuit arrangement in accordance with claim 7, wherein said referencing input node is at a mid-potential point of said operating voltage.

10. A circuit arrangement in accordance with claim 7, wherein said referencing input node is connected to one pole of said operating voltage.

11. A circuit arrangement in accordance with claim 10, wherein said one pole is coupled to a non-inverting input of said differential input.

12. A circuit arrangement in accordance with claim 8, wherein said output of said differential amplifier provides an output signal with reference to said point of a reference potential.

13. A circuit arrangement in accordance with claim 12, wherein said operational amplifier is arranged as a voltage follower with respect to said alternating signal voltage.

14. A circuit arrangement in accordance with claim 13, wherein said operational amplifier is arranged as a voltage follower having a predetermined voltage gain.

15. A circuit arrangement in accordance with claim 14, wherein said output of said differential amplifier provides an output signal for a load coupled between said output and said point of a reference potential.

16. A circuit arrangement in accordance with claim 15, wherein said output is coupled for negative feedback to said differential input.

17. A circuit arrangement in accordance with claim 5, wherein said alternating signal voltage is applied in a common mode to said differential input, and is applied to said power supply terminals of said operational amplifier with a DC potential difference between said power supply terminals corresponding to said operating voltage.

18. A circuit arrangement in accordance with claim 17, wherein said output signal is representative of a superposition of said relatively small audio signal voltage including said DC component of a given value and of said alternating signal voltage.

19. A circuit arrangement in accordance with claim 5, wherein said alternating signal voltage is provided by switching converter means.

20. A circuit arrangement for transmitting to a remote receiver a relatively small audio signal voltage including a DC component of a given value, and a relatively large alternating signal voltage, said circuit arrangement comprising an operational amplifier having a predetermined amplification, having a differential input, an output, and a pair of supply terminals for receiving there between an operating voltage from a power supply, wherein said power supply is floating with respect to a point of a reference potential; said differential amplifier is floating relative to said point of a reference potential:

said audio signal voltage is applied in a differential mode to said differential input; and said operating voltage from said power supply and said alternating signal voltage are superimposed and applied to said differential amplifier by way of said power supply terminals.

21. A circuit arrangement in accordance with claim 20, wherein said alternating signal voltage is applied in common mode to said power supply terminals with a DC potential difference between said power supply terminals corresponding to said operating voltage.

22. A circuit arrangement in accordance with claim 21, wherein said power supply has a referencing input node for referencing a floating potential for said supply voltage, and wherein said alternating signal voltage is applied between a point of a reference potential and said referencing input node.

23. A circuit arrangement in accordance with claim 22, wherein said referencing input node is at a mid-potential point of said operating voltage.

24. A circuit arrangement in accordance with claim 23, wherein said referencing input node is connected at one pole of said operating voltage.

25. A circuit arrangement in accordance with claim 10, wherein said one pole is connected to a non-inverting input of said differential input.

26. A circuit arrangement in accordance with claim 25, wherein said output of said differential amplifier provides an output signal with reference to said point of a reference potential.

27. A circuit arrangement in accordance with claim 26, wherein said operational amplifier is arranged as a voltage follower with respect to said alternating signal voltage.

28. A circuit arrangement in accordance with claim 27, wherein said operational amplifier is arranged as a voltage follower having a predetermined voltage gain.

29. A circuit arrangement in accordance with claim 28, wherein said output is coupled for negative feedback to said differential input.

30. A circuit arrangement in accordance with claim 20, wherein said alternating signal voltage is applied in a common mode to said differential input, and is applied to said supply inputs of said operational amplifier with a DC potential difference between said power supply terminals corresponding to said operating voltage.

31. A circuit arrangement in accordance with claim 26, wherein said output signal is representative of a superposition of said relatively small audio signal voltage including said DC component of a given value and of said relatively large alternating signal voltage.

32. A circuit arrangement in accordance with claim 31, wherein said alternating signal voltage is provided by switching converter means.

33. A circuit arrangement for supplying to a remote receiver circuit, a first, relatively small amplitude signal from the first signal source, including a DC component of a predetermined amount, as in the transmission of an alternating speech signal, and a second, relatively large amplitude signal from a second signal source, as in the transmission of an alternating ringing signal, said circuit arrangement comprising an operational amplifier having a predetermined gain, having fist and second input terminals for forming a differential input, having first and second power supply terminals for receiving a supply voltage from a power supply source having first and second power supply output terminals, and having an output terminal, wherein said first signal source is coupled between said first and second input terminals;

said first and second power supply output terminals are coupled to respective ones of said first and second power supply terminals; and said second signal source is coupled between a common node of said power supply source and a point of a reference potential, whereby said power supply output terminals are driven in common mode by said second signal with respect to said point of a reference potential, and an output voltage is provided between said output terminal and said point of a reference potential.

34. A circuit arrangement in accordance with claim 33, wherein said common node of said power supply source is connected to one of said power supply output terminals.

35. A circuit arrangement in accordance with claim 34, wherein said common node of said power supply source is connected to a point of potential intermediate the potentials of said power supply output terminals.

36. A circuit arrangement in accordance with claim 34, wherein said common node of said power supply source is connected to a point of potential substantially halfway between the potentials of said power supply output terminals.

37. A circuit arrangement in accordance with claim 36, wherein said common node of said power supply source is connected to a non-inverting one of said first and second input terminals of said differential input, said operational amplifier output terminal is coupled by way of impedance means to an inverting one of said first and second input terminals of said differential input for providing negative feedback for setting said operational amplifier to operate at a relatively high gain level with respect to said relatively small signal, and said operational amplifier operates as a voltage follower with a relatively low gain with respect to said relatively large amplitude signal.

38. A circuit arrangement in accordance with claim 37, wherein said relatively low gain with respect to said relatively large amplitude signal is in the order of unity gain.

39. Circuitry according to claim 1, characterized in that the high energy alternating signal is a ringing alternating voltage for signaling.

* * * * *